United States Patent
Teramoto et al.

[19]

[11] Patent Number: 5,897,344
[45] Date of Patent: Apr. 27, 1999

[54] METHOD OF MAKING A THIN FILM SEMICONDUCTOR DEVICE

[75] Inventors: Satoshi Teramoto; Hongyong Zhang; Yasuhiko Takemura, all of Kanagawa, Japan

[73] Assignee: Semiconductor Energy Laboratory Co., Ltd., Kanagawa, Japan

[21] Appl. No.: 08/779,114

[22] Filed: Jan. 6, 1997

Related U.S. Application Data

[60] Continuation of application No. 08/462,772, Jun. 5, 1995, abandoned, which is a division of application No. 08/252,197, Jun. 1, 1994, abandoned.

[30] Foreign Application Priority Data

Jun. 4, 1993 [JP] Japan ..................................... 5-160258

[51] Int. Cl.⁶ .................................................. H01L 21/00
[52] U.S. Cl. .......................... 438/149; 438/151; 438/154; 438/163; 438/164
[58] Field of Search ................................ 437/41 TFT, 44, 437/40, 21; 257/59, 900, 57, 66, 351, 408, 410, 412; 359/59; 438/149, 151, 154, 163, 164

[56] References Cited

U.S. PATENT DOCUMENTS

| | | | |
|---|---|---|---|
| 4,638,347 | 1/1987 | Iyer | 357/54 |
| 5,289,030 | 2/1994 | Yamazaki et al. | 257/410 |
| 5,308,998 | 5/1994 | Yamazaki et al. | 437/41 TFT |
| 5,341,012 | 8/1994 | Misawa et al. | 257/351 |
| 5,407,837 | 4/1995 | Eklund | 437/21 |
| 5,426,062 | 6/1995 | Hwang | 437/21 |

FOREIGN PATENT DOCUMENTS

| | | | |
|---|---|---|---|
| 60-91674 | 5/1985 | Japan | 257/900 |
| 1-243471 | 3/1988 | Japan | . |
| 4-26132 | 1/1992 | Japan | 437/44 |
| 5-152335 | 6/1993 | Japan | 437/41 TFT |

OTHER PUBLICATIONS

"Tapered Sidewall Field–Effect Transistor Gates", IBM Tech Disclosure Bulletin, vol. 29, No. 7, Dec. 1986.

IBM Technical Disclosure Bulletin, vol. 29, No. 7, Dec. 1986, p. 2913, "Tapered Sidewall Field–Effect Transistor Gates".

*Primary Examiner*—John F. Niebling
*Assistant Examiner*—Lynne A. Gurley
*Attorney, Agent, or Firm*—Sixbey, Friedman, Leedom & Ferguson, P.C.; Gerald J. Ferguson, Jr.; Jeffrey L. Costellia

[57] ABSTRACT

Method of improving making contact with the source/drain regions of thin-film transistors. A substantially triangular insulator determines contacts with the source/drain regions by a self-aligning process. The width of this insulator can be determined without performing mask alignment. Furthermore, the width can be reduced. Therefore, the sheet resistance of the source/drain regions presents no serious problems.

11 Claims, 6 Drawing Sheets

METHOD OF MAKING A THIN FILM SEMICONDUCTOR DEVICE

This application is a Continuation of Ser. No. 08/462,772, filed Jun. 5, 1995, now abandoned; which itself is a division of Ser. No. 08/252,197, filed Jun. 1, 1994, now abandoned.

FIELD OF THE INVENTION

The present invention relates to thin-film transistors (TFTs) and also to a method of fabricating TFTs. Furthermore, the invention relates to a semiconductor device utilizing such TFTs.

BACKGROUND OF THE INVENTION

Figure 6A:
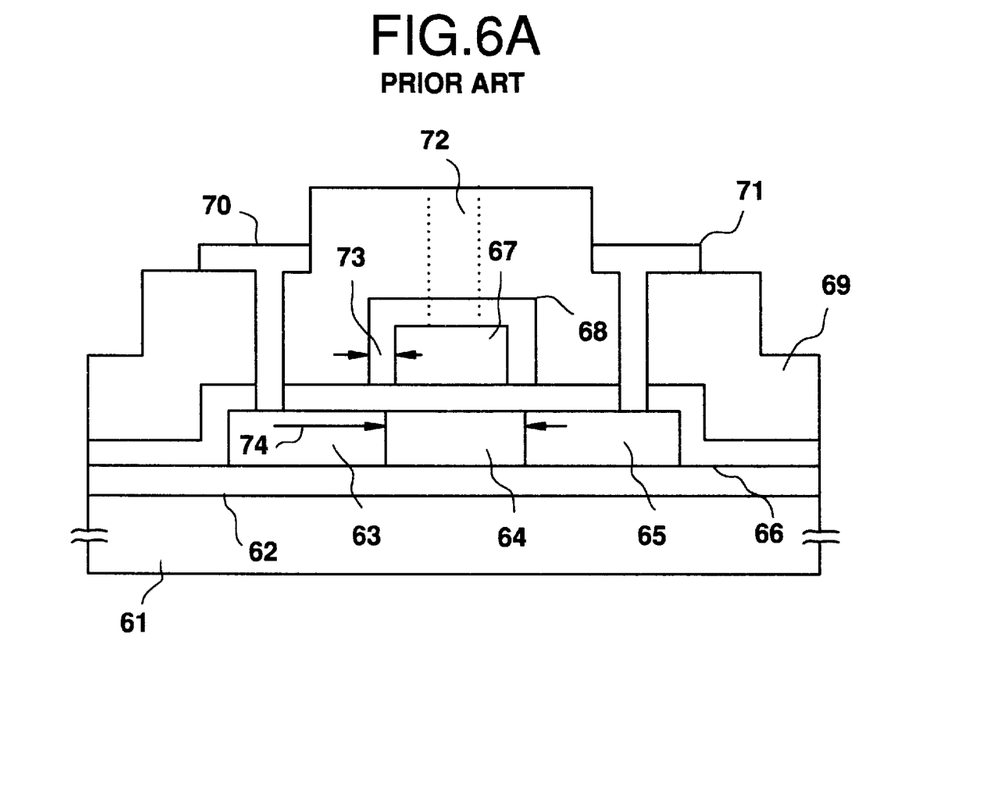
FIG. 6(A) is a cross-sectional view of conventional TFTs.

TFTs (thin-film transistors) have heretofore found wide acceptance in active-matrix liquid crystal displays, image sensors, and other devices packed on glass substrates. FIG. 6(A) is a schematic cross section of an insulated-gate field effect transistor (hereinafter simply referred to as a TFT) formed on a glass substrate. This TFT uses a thin-film silicon semiconductor formed on the glass substrate. A bottom layer 62 made of silicon oxide having a thickness of about 2000 Å is formed on the glass substrate, indicated by 61. An active layer made of the silicon semiconductor film having source/drain regions 63, 65, and a channel formation region 64 is formed on the silicon oxide film 62. This silicon semiconductor film has a thickness of approximately 1000 Å and is amorphous or crystalline (consisting of polycrystals or crystallites).

A silicon oxide film 66 forming a gate-insulating film is formed on the active layer to a thickness of about 1000 Å. A gate electrode 67 is made of aluminum. An oxide layer 68 is formed out of aluminum around the gate electrode 67 to a thickness of about 2000 Å by anodic oxidation. An interlayer insulator 69 is made of silicon oxide or the like. Contact holes 72 permitting contact with source/drain electrodes 70, 71 and with the gate electrode 67 are formed. The contact hole 72 for the gate electrode 67 is present on the rear side or front side of the plane of FIG. 6(A), i.e., is not coplanar with the source/drain electrodes 70 and 71.

The structure shown in FIG. 6(A) is characterized in that an offset gate region is formed by a self-aligning process because of the thickness 73 of the oxide layer 68 around the gate electrode 67, the oxide layer 68 being formed by anodic oxidation of the gate electrode 67 of aluminum. In particular, after the oxide layer 68 is formed, impurity ions are implanted to form the source/drain regions. Therefore, a region corresponding to the thickness of the oxide layer 68 can be formed as an offset region.

In practice, however, the impurities diffuse themselves and so the boundary between the source/drain regions 63, 65 and the channel formation region 64 is offset toward the channel formation region from the location corresponding to the end of the oxide layer 68. Therefore, the thickness of the oxide layer 68 must be determined, taking this into consideration. That is, it is common practice to make the thickness of the oxide layer 68 larger than the length of the given offset gate.

When the contact holes for the source/drain regions 63, 65 are formed, if overetching is done, the portions surrounding the contact holes are overetched around the interface with the silicon oxide film 66. If aluminum electrodes 70 and 71 are subsequently formed, aluminum atoms diffuse to the surrounding etched portions. Sometimes, aluminum atoms diffuse close to the channel formation region 64, thus deteriorating the characteristics and the reliability of the TFT.

On the other hand, where the distance 74 between the contact portion for the source/drain region and the channel formation region 64 is larger, the sheet resistance of the source/drain region poses problems. One conceivable method of solving this problem is to reduce the distance indicated by 74. However, the distance cannot be reduced greatly because of the accuracy of mask alignment. Especially, where the used substrate is made of glass, shrinkage of the glass substrate caused during a heating step presents problems. Hence, the accuracy of mask alignment results in serious problems. For example, if a glass substrate 10 cm or more square is heated to about 600° C., the substrate shrinks easily by about several micrometers. Therefore, the present situation is that the distance indicated by 74 contains a margin of approximately 20 μm.

Where the problems with overetching caused during formation of the contact holes for the source/drain regions are considered, it is impossible to reduce the distance 74 by a great extent. As described thus far, the prior art TFTs suffer from two problems; (1) The formation of the contact holes for the source/drain regions presents problems; and (2) In association with (1), the contact holes cannot be formed close to the channel formation region; Consequently, the sheet resistance of the source/drain regions poses problems.

Figure 6B:
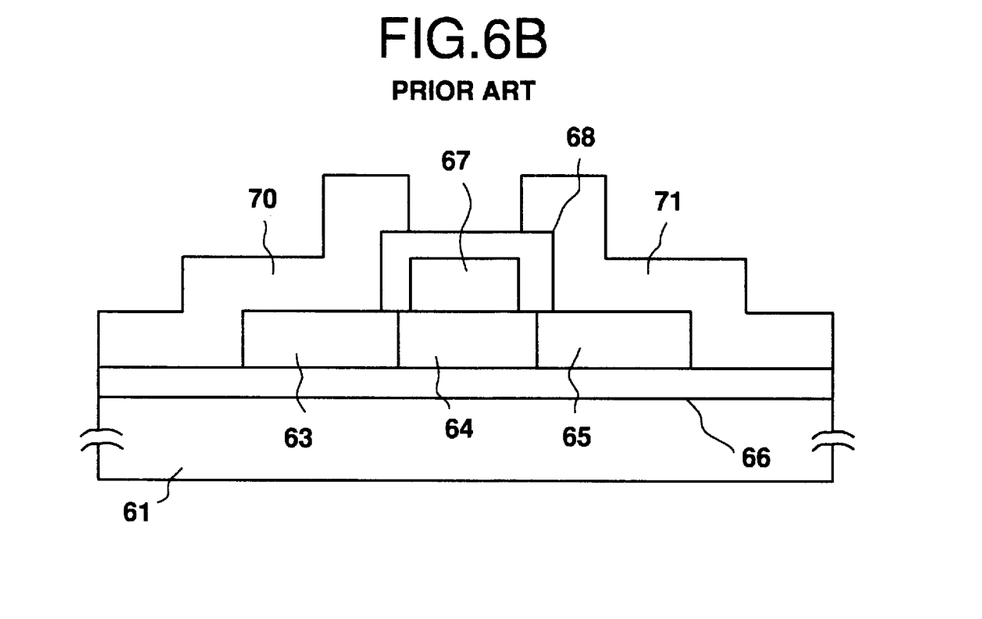
FIG. 6(B) is a cross-sectional view of known TFTs.

A TFT of a structure as shown in FIG. 6(B) has been proposed as a structure free from the problems (1) and (2) with the TFT shown in FIG. 6(A). This TFT has a gate electrode 67 consisting mainly of aluminum in the same way as the TFT shown in FIG. 6(A). An oxide layer 68 is formed around the gate electrode 67 by anodic oxidation. Source/drain electrodes 70 and 71 are formed in intimate contact with the oxide layer 68. In this structure, it is inevitable that the oxide layer 68 is interposed between the source/drain electrodes 70, 71 and the gate electrode 67. Therefore, parasitic capacitance induced by the presence of the intervening oxide layer 68 presents a problem. That is, the operation is made unstable and the reliability deteriorates. The above problem may be solved by increasing the thickness of the oxide layer 68. However, it is impossible to increase the thickness greatly, because the thickness of the oxide layer 68 determines the length of the offset gate.

SUMMARY OF THE INVENTION

It is an object of the present invention to provide a TFT free from the foregoing problems or a semiconductor device using such a TFT.

It is another object of the invention to provide a method of accurately forming contact holes for source/drain regions in a channel formation region in staggered positions.

It is a further object of the invention to provide a method of fabricating a TFT having high reliability or a semiconductor device using such a TFT.

The present invention is now described briefly by referring to FIG. 1, (A)–(D). An aluminum oxide layer 16 is formed around each gate electrode 15 consisting mainly of aluminum. A substantially triangular insulator 22 made of silicon oxide is formed around and in contact with the aluminum oxide layer 16. This insulator 22 determines the positions at which electrodes 23 and 24 are in contact with source/drain regions 17 and 19, respectively. This substantially triangular insulator is formed at a position indicated by the broken line 21, by effecting vertical anisotropic etching after depositing the silicon oxide film 20.

The dimensions of the substantially triangular insulator 22, especially the dimension indicated by 25, are determined by the thickness of the previously formed insulator 20, the etching conditions, and the height of the gate electrode 15. In this case, the height of the gate electrode 15 includes the thickness of the insulator layer 16. Generally, the dimension 25 is approximately 2,000 to 20,000 Å but may be determined according to the actual structure of the device. Also, the shape of this insulator 22 is not restricted to a triangular form. The shape is affected by the step coverage and the film thickness of the oxide 20. As an example, where the dimension 25 is reduced, the shape is a rectangle. For simplicity, the insulator 22 is hereinafter assumed to have a substantially triangular shape as shown.

In the TFT shown in FIG. 1, (A)–(D), the insulator layer 16 is formed around the gate electrode. This insulator 16 may be omitted, in which case the insulator 22 is in intimate contact with a side surface of the gate electrode.

A substantially triangular insulator is formed on the side of the gate electrode by a self-aligning process. This makes it unnecessary to form contact holes for the source/drain regions. The substantially triangular insulator permits the contact positions with the source/drain regions to be formed close to the channel formation region.

Other objects and features of the invention will appear in the course of the description thereof, which follows.

DETAILED DESCRIPTION OF THE INVENTION

EXAMPLE 1

FIG. 1, (A)–(D), schematically illustrate steps for manufacturing a TFT in the present example. What are fabricated in the present example are N-channel TFTs. Of course, P-channel TFTs can be fabricated by forming source/drain regions out of a P-type semiconductor. In the description made below, silicon semiconductor is used as a semiconductor. Obviously, other semiconductors may be used. The TFTs of the present example can be utilized as TFTs formed in pixels of a liquid crystal display and as TFTs used in a peripheral circuit thereof, in an image sensor, and in other IC.

Figure 1A:
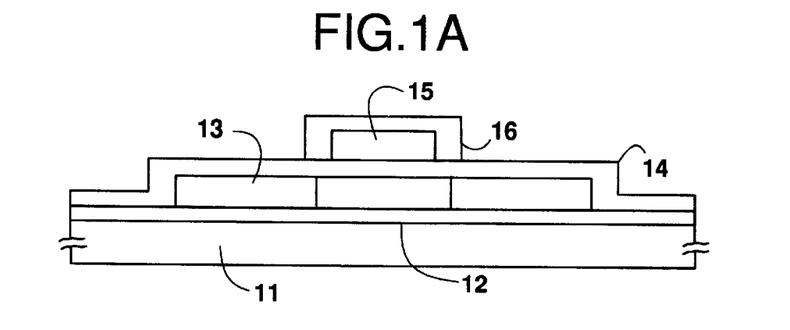
FIGS. 1(A) to 1(D) are cross-sectional views of TFTs according to the present invention, illustrating successive steps for fabricating the TFTs.

In the present example, a substrate 11 is made of glass. First, silicon oxide is sputtered on the glass substrate 11 to a thickness of 2000 Å to form a bottom layer 12. Then, an amorphous silicon film 13 is formed to a thickness of 1000 Å by plasma CVD. The method of forming the amorphous silicon film 13 and the thickness of the film 13 are determined by the actual structure of the device. No restrictions are imposed on these method and film thickness. Furthermore, a crystalline silicon film such as a crystallite silicon film or a polysilicon film can also be used.

Then, the amorphous silicon film 13 is crystallized at 600° C. for 24 hours to form a crystalline silicon film. The film was photolithographically patterned to isolate individual devices. In this way, an active layer region is obtained. This active layer region is a semiconductor region containing islands which form source/drain regions and a channel formation region. Thereafter, a silicon oxide film 14 becoming a gate-insulating film is formed to a thickness of 1000 Å by sputtering techniques. This silicon oxide film 14 may also be formed out of organic silane (e.g., TEOS) and oxygen by plasma CVD. Subsequently, an aluminum film becoming gate electrodes is formed to a thickness of 6000 to 8000 Å. In the present example, the thickness is 6000 Å. This aluminum film contains about 0.1 to 2% silicon. The gate electrodes can consist mainly of silicon or can be made of a metal suicide or a lamination of silicon and a metal.

Then, the aluminum film is photolithographically patterned to form gate electrodes 15. The surface of each gate electrode 15 is anodized to form an oxide layer 16 on the surface. The oxide layer 16 comprises an anodic oxide of a material of the gate electrode 15. This anodization is carried out within an ethylene glycol solution containing 1–5% tartaric acid. In the present example, the thickness 26 of the oxide layer 16 at its side surface is 2000 Å. An offset gate region is formed, utilizing this thickness, in a later impurity ion implantation step. In this way, a shape as shown in FIG. 1(A) is obtained.

Then, impurities, or phosphorus ions, are implanted into the crystalline silicon film 13 that is formed as an active layer to impart conductivity type N to the silicon film 13. At this time, source/drain regions 17, 19 and a channel formation region 18 are formed by a self-aligning process in which the gate electrodes 15 and the surrounding oxide layer 16 act as a mask. Then, these regions are annealed by laser irradiation to activate the implanted phosphorus ions and to anneal the silicon film having deteriorated crystallinity. This anneal may also be carried out by lamp annealing using irradiation of infrared radiation. Furthermore, well-known heating may be exploited. However, annealing making use of infrared radiation (e.g., infrared radiation having a wavelength of 1.2 $\mu$m) is advantageous where shrinkage of the glass substrate presents problems, for the following reasons. Infrared radiation is selectively absorbed by silicon semiconductor and does not heat the glass substrate so much. In addition, the period of one shot of infrared radiation can be limited within only several seconds. At this time, phosphorus ions slightly diffuse toward the channel formation region and so the boundary between the source/drain regions 17, 19 and the channel formation region 18 is shifted toward the channel formation region 18 from the oxide layer 16.

Figure 1B:
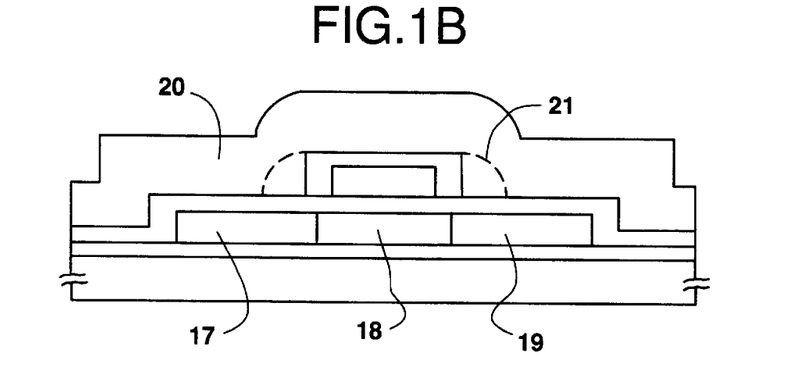

Then, a silicon oxide layer 20 is formed to a thickness of 6000 Å by sputtering. Instead of sputtering, plasma CVD using both TEOS and oxygen may be employed. This silicon oxide film assumes a shape as shown in FIG. 1(B) above the gate electrodes 15 having a large step. This shape is varied by the step coverage and the thickness of the silicon oxide film 20.

Anisotropic etching is effected by a well-known RIE process to etch the silicon oxide film 20. Each gate electrode 15 has a height of 6000 Å at its side. The thickness in the direction of the height is about twice as large as the film thickness, i.e., 6000 Å. Therefore, if the etching process is continued, the silicon oxide can be left in the shape indicated by the broken line 21. At this time, the silicon oxide film 14 which is a gate-insulating film is also etched, thus exposing the source/drain regions 17 and 19. In this case, a step exists at the ends of the crystalline silicon film 13 which has been patterned as an active layer. However, the height is only on the order of 1000 Å and so the silicon oxide film 20 is hardly left in this portion. In the process sequence illustrated in FIG. 1, (A)–(D), the silicon oxide film 20 is formed in the shape shown in FIG. 1(B). Therefore, the silicon oxide is left in the shape indicated by the broken line 21. If the silicon oxide film 20 is formed while directly reflecting the shape of the gate electrode, i.e., it swells while maintaining a rectangular form, then the shape indicated by the broken line 21 becomes a square or rectangular form.

Figure 1C:
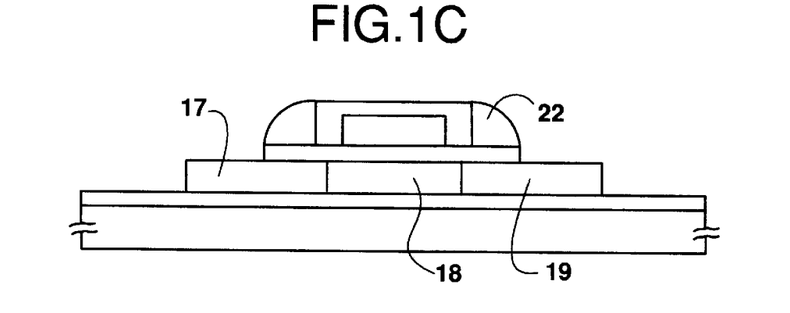

In this way, the silicon oxide is left in a substantially triangular form 22 as shown in FIG. 1(C). In the present example, the width 25 of this triangular silicon oxide 22 is about 3000 Å. This value can be determined, taking account of the film thickness of the silicon oxide film 20, the etching conditions, and the height of the gate electrode 15 (including the oxide layer 16). Aluminum electrodes 23 and 24 are formed as source/drain electrodes. Thus, N-channel TFTs are completed (FIG. 1(D)).

Figure 1D:
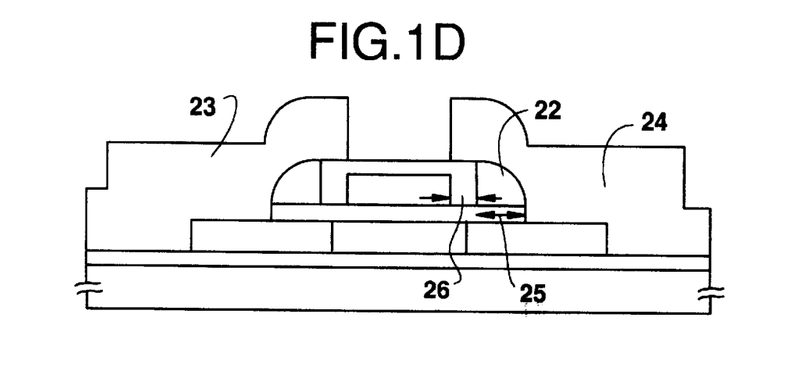

These aluminum electrodes 23 and 24 can be made of a chromium/aluminum multilayer film. In this case, a chromium film is used as the bottom layer. This improves the electrical contact of the electrodes with the source/drain electrodes. Furthermore, a lamination of chromium, titanium, and aluminum can be employed.

The N-channel TFTs completed in this way can determine the contact portions at which the source/drain electrodes are in contact with the electrodes in a self-aligning process because of the presence of the triangular silicon oxide film 22. In addition, the positions of the contact portions can be determined irrespective of shrinkage of the glass substrate 11. In addition, the contact positions can be made as close as possible to the channel formation region. Therefore, if the sheet resistance of the source/drain regions is high, TFTs almost free from problems can be fabricated. Additionally, a step of forming holes in the gate-insulating film to create the source/drain electrodes can be omitted. Hence, the various problems with this fabrication step can be fundamentally solved.

In the structure of the present example, silicon oxide ($SiO_2$) 22 and aluminum oxide ($Al_2O_3$) formed by anodic oxidation are formed on the side surfaces of the gate electrodes 15. In consequence, the parasitic capacitance between each gate electrode and the source/drain electrodes can be reduced.

EXAMPLE 2

The process sequence of the present example is illustrated in FIG. 2, (A)–(D). It is to be noted that like components are indicated by like reference numerals in various figures. First, silicon oxide is sputtered as a 2000 Å-thick film on a glass substrate 11. Then, an amorphous silicon film 13 is formed to a thickness of 1000 Å by plasma CVD. The amorphous silicon film 13 is crystallized by conducting an anneal at 600° C. for 24 hours. In this way, a crystalline silicon film is obtained.

Figure 2A:
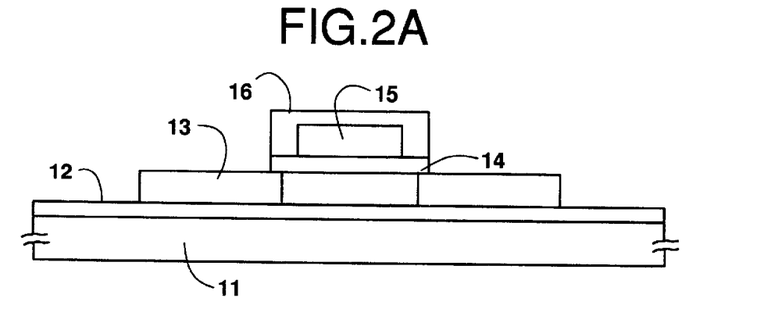
FIGS. 2(A) to 2(D) are cross-sectional views of other TFTs according to the invention, illustrating successive steps for fabricating the TFTs.

Then, an aluminum film is formed as a 6000 Å-thick film. Aluminum gate electrodes 15 having an oxide layer 16 on their surfaces are formed by the same step as the step of the process illustrated in FIG. 1, (A)–(D), the oxide layer 16 having a thickness of 2000 A. Those portions of the gate-insulating film 14 which exclude the gate electrodes are etched away. Thus, a structure as shown in FIG. 2(A) is obtained. Thereafter, phosphorus ions are implanted to form source/drain regions 17, 19 and a channel formation region 18 by a self-aligning process. This ion implantation step may be carried out before the silicon oxide film 14 acting as a gate insulator is removed. The source/drain regions 17 and 19 are activated by annealing such as laser annealing, lamp annealing, or other annealing using heating.

Figure 2B:
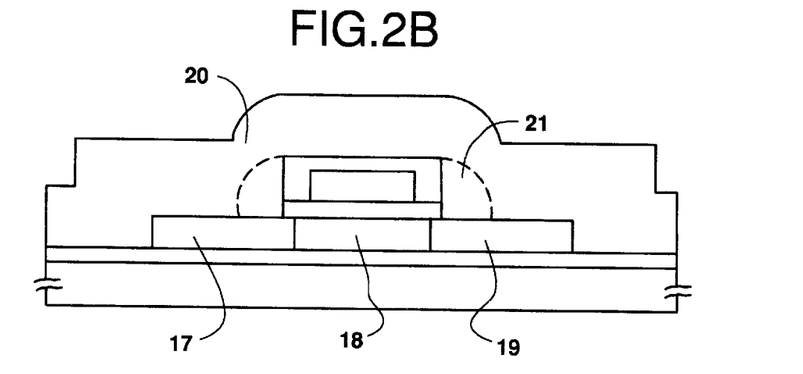
Figure 2C:
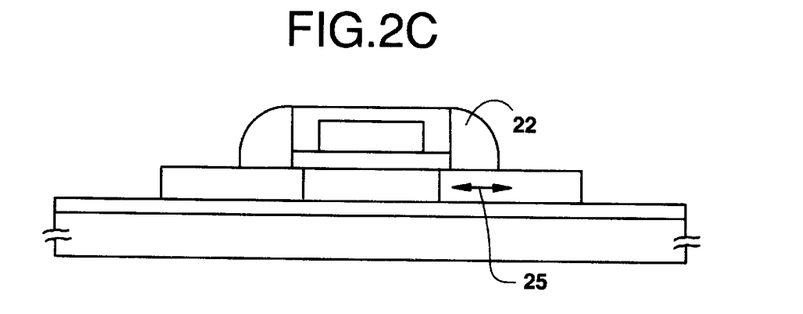
Figure 2D:
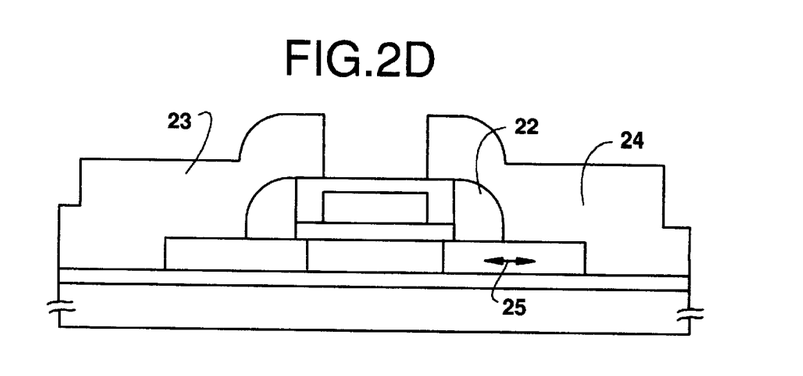

Then, silicon oxide is sputtered as a 6000 Å-thick film 20. This is etched by RIE in the same way as in the process of Example 1. A substantially triangular silicon oxide 22 is left in a portion indicated by 21. Thereafter, aluminum electrodes 23 and 24 are formed. In this way, N-channel TFTs are completed.

The present example yields the same advantages as does the structure of Example 1. Specifically, the width 25 of the substantially triangular silicon oxide 22 can be reduced to about 3000 Å. This facilitates making contacts between the source/drain regions 17, 19 and electrodes 23, 24. Furthermore, the margin for the sheet resistance of the source/drain regions 17, 19 is increased. Of course, the dimension 25 can be set to a desired value, by taking account of the thickness of the silicon oxide film 20, the conditions under which the silicon oxide film 20 are etched, and the height of the gate electrodes 15 including the oxide layer 16.

EXAMPLE 3

The present example pertains to techniques for fabricating two kinds of TFTs on the same substrate at the same time. TFTs of one kind are used in a peripheral driver circuit for an active-matrix liquid crystal electro-optical display device. TFTs of the other kind are used for switching devices formed in the pixels. In a known active-matrix liquid crystal display, TFTs for switching devices formed in pixels and TFTs formed in the peripheral driver circuit are formed on the same substrate, especially a substrate made of glass. The structure of this system is schematically shown in FIG. 3(A).

Figure 3A:
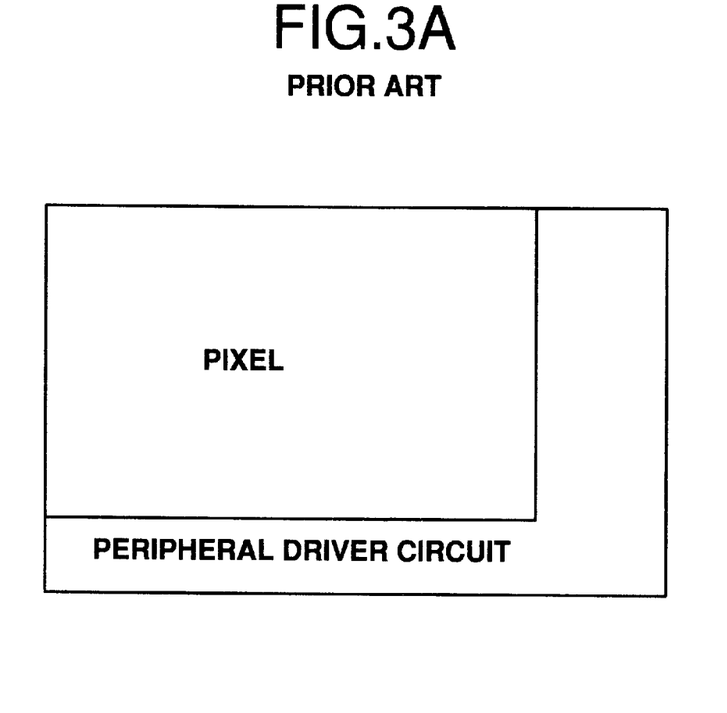
FIG. 3(A) is a conceptual diagram illustrating an active-matrix liquid crystal display.

In the configuration of FIG. 3(A), TFTs formed in the pixel portions and the TFTs formed in the peripheral driver circuit are required to have different characteristics. The TFTs formed in the pixel portions are required to have a small OFF current in order to enhance the pixel charge holding ratio. However, neither a high mobility nor a large ON current is necessary. On the other hand, TFTs formed in the peripheral driver circuit are required to have a high mobility and a large ON current.

Obviously, these two kinds of TFTs differ in shape. The TFTs formed in the pixel portions have a channel length of 5 to 20 $\mu$m, e.g., about 10 $\mu$m. The width is also about 10 $\mu$m. The TFTs formed in the peripheral driver circuit also have a channel length of about 10 $\mu$m but the channel width is 50 to 200 $\mu$m, e.g., on the order of 150 $\mu$m. In this way, these TFTs have extremely wide channels because larger currents must flow through the TFTs formed in the peripheral driver circuit than currents flowing through the TFTs in the pixel portions, the latter TFTs acting to hold electric charge in the pixels.

Figure 3B:
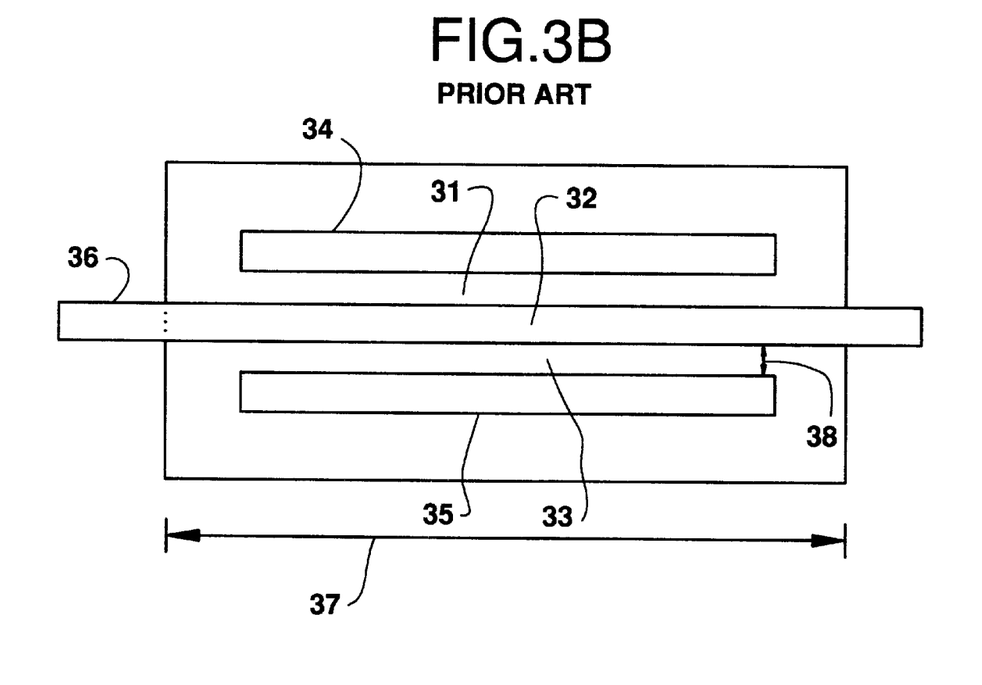
FIG. 3(B) is a schematic diagram illustrating TFTs for a peripheral driver circuit for the active-matrix liquid crystal display shown in FIG. 3(A)

FIG. 3(B) is a top view of a TFT formed in a peripheral driver circuit portion. In this figure, each gate electrode 36 generally has a width of 10 $\mu$m. This means that the channel length is about 10 $\mu$m. Also shown are source/drain regions 31, 33 and contact portions 34, 35 for the source/drain regions. Source/drain electrodes are formed in these contact portions. A channel formation region 32 is formed under the gate electrode 36.

The characteristics required for the TFTs forming the peripheral driver circuit are obtained by increasing the channel width 37. This requirement is also achieved by other various methods. For example, the distance 38 between the contact portions 34, 35 for the source/drain regions and the channel formation region 32 is reduced to lower the resistance between the source and drain regions. The sheet resistance itself of the source/drain regions is reduced. However, the present situation is that the distance indicated by 38 is set to on the order of 20 $\mu$m because of the aforementioned shrinkage of the glass substrate, accuracy of the mask alignment, and problems with formation of the contact portions. Moreover, restrictions are placed on reductions in the sheet resistance of the source/drain regions.

Accordingly, when the source/drain contact portions are formed, the present example yields the following advantages: (1) The mask alignment step presents no problems; (2) When contact holes are formed, no problems take place; and (3) The distance between the contact portions and the channel formation region can be set by a self-aligning process. TFTs formed in the peripheral driver circuit can have these advantages. Conventional TFTs are formed in the pixel portions at the same time.

The process sequence of the present example is illustrated in FIG. 4, (A)–(D). In these figures, the left one is a conventional TFT formed in a pixel portion. The right one is a TFT formed in a peripheral driver circuit. First, silicon oxide is sputtered as a 1000 Å-thick film 42 on a glass substrate 41 to form a bottom layer. Then, an amorphous silicon film, including source/drain regions 43, 45, 46 and 48 and channel regions 44 and 47, is formed by plasma CVD. The amorphous silicon film is heated at 600° C. for 48 hours to crystallize it. Subsequently, the devices are isolated, and an active layer is formed in each device region. That is, an active layer, including source/drain regions 43 and 45 and channel region 44—and after the second occurrence of "layer," delete "46–48" and insert—including source/drain regions 46 and 48 and channel region 47, for the TFT for the pixel and an active layer, 46–48, for the TFT for the peripheral driver circuit are formed.

Figure 4A:
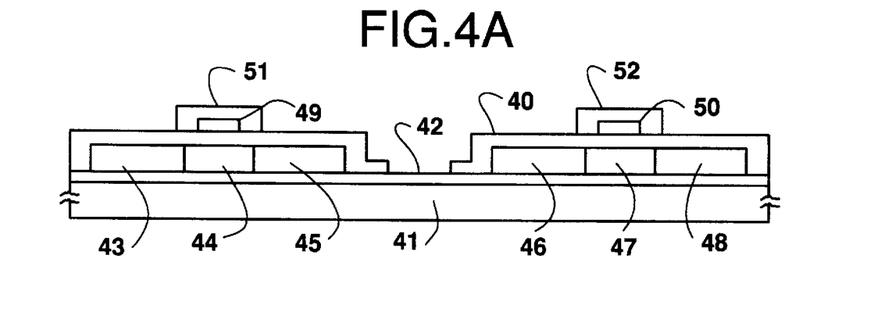
FIGS. 4(A) to 4(D) are cross-sectional views of further TFTs according to the present invention, illustrating successive steps for fabricating the TFTs.
Figure 4B:
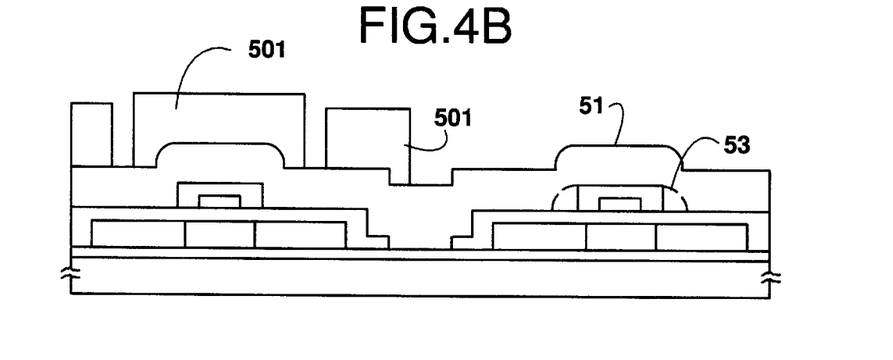

Then, silicon oxide is sputtered as a 1000 Å-thick film 40 to form a gate-insulating film. This silicon oxide film 40 is patterned photolithographically. An aluminum film containing 1% silicon forming gate electrodes 49 and 50 deposited to a thickness of 6000 Å. This aluminum film is patterned to form the gate electrodes 49 and 50. Oxide layers 51 and 52 are formed to a thickness of 2000 Å by anodization. Phosphorus ions are implanted so that source/drain regions 43, 45, 46, and 48 are doped n-type. Channel formation regions 44 and 47 are formed by a self-aligning process. In this way, source/drain regions 43 and 45 of TFTs in pixels are formed. Source/drain regions 46 and 48 are formed for TFTs in the peripheral driver circuit.

Figure 4C:
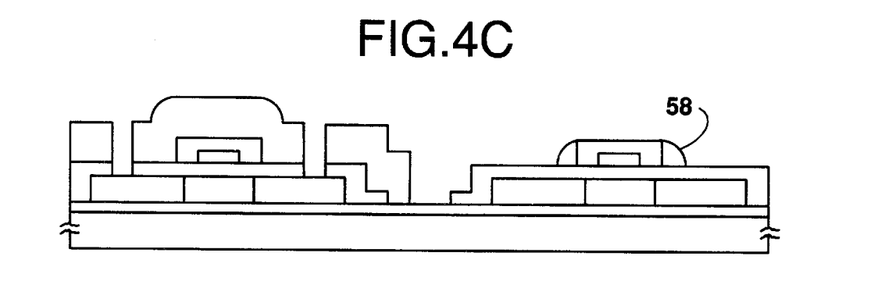
Figure 4D:
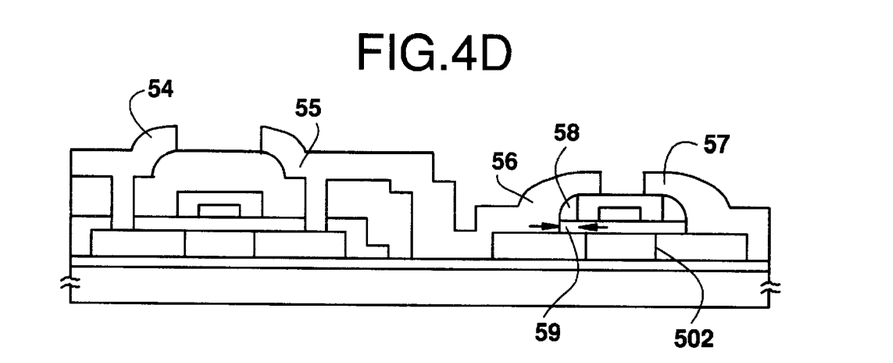

Thereafter, the source/drain regions are illuminated with laser light or infrared light to activate these regions. A silicon oxide film 51 having a thickness of 6000 Å is formed by sputtering or plasma CVD. A resist 501 is coated on the top surface of the left TFT for a pixel, and the resist is etched by RIE. Holes for making contacts with the source/drain regions of the left TFT for a pixel are formed at the same time. As shown in FIG. 4(C), silicon oxide 58 is left as a substantially triangular form as indicated by the broken line 53. Then, source/drain electrodes 54, 55 of the left TFT for the pixel and source/drain electrodes 56, 57 of the right TFT for the peripheral driver circuit are formed at the same time. Their outputs 55 and 56 are interconnected. Thus, a circuit is completed. Because of the substantially triangular, remaining silicon oxide 58, the contact portions for the source/drain electrodes of the right TFT are determined by a self-aligning process. In the present example, the distance indicated by 59 can be set to on the order of 3000 Å. Therefore, if the sheet resistance of the source/drain regions is high, the requirements for the characteristics of TFT for the peripheral driver circuit can be catered for.

Figure 5:
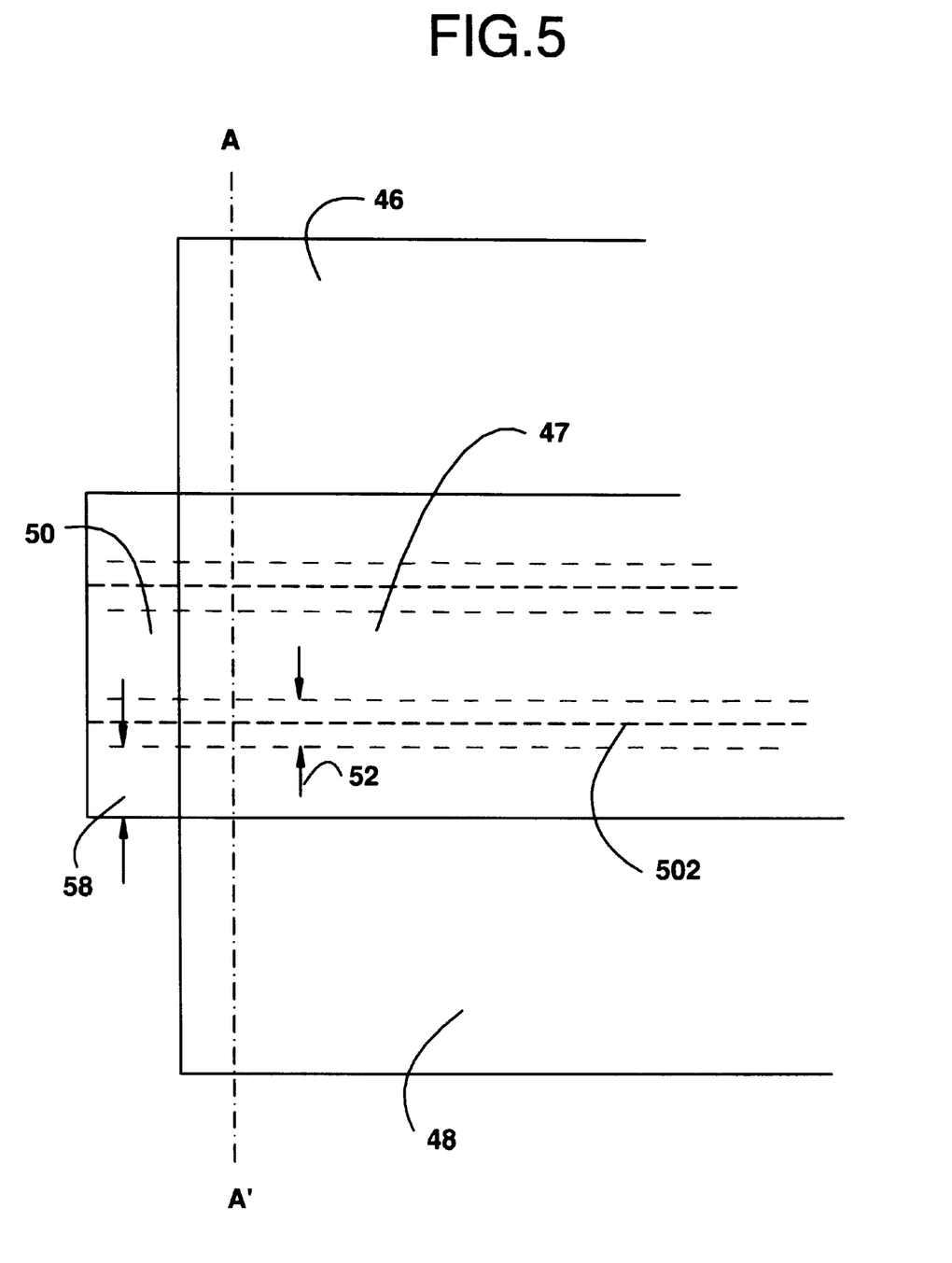
FIG. 5 is a top view of the right one of the TFTs shown in FIGS. 4(A) to 4(D)

FIG. 5 is a top view of the right TFT for the peripheral driver circuit and shows the portions around the ends of the gate electrode. The cross section taken on line A–A' of FIG. 5 corresponds to the cross section of the right TFT shown in FIG. 4(D). Like components are indicated by like reference numerals in FIGS. 4, (A)–(D), and 5. In FIG. 5, an oxide layer 52 is formed around a gate electrode 50 and acts to form an offset gate region by a self-aligning process during impurity ion implantation. A substantially triangular insulator 58 consists of silicon oxide. As shown also in FIG. 4(D), the boundary between a channel formation region 46, 47 and a drain or source region 48 is indicated by 502, the channel formation region 47 being formed under the gate electrode 50. This boundary 502 is shifted toward the inside of the oxide layer 52, i.e., toward the channel, because of diffusion of the impurity ions such as phosphorus ions or boron ions.

EXAMPLE 4

In the present example, complementary TFTs consist of an N-channel TFT (NTFT) and a p-channel TFT (PTFT) formed on a glass substrate. The process sequence is essentially the same as the process sequence of Example 3 unless specifically stated.

The process sequence of the present example for manufacturing complementary TFTs is now described by referring to FIG. 4, (A)–(D). The present example is similar to Example 3 except that the left one is an NTFT and the right one is a PTFT, and that both TFTs are constructed as shown to the right of FIG. 4(D).

In Example 3, both TFTs are fabricated as NTFTs in the step illustrated in FIG. 4(A). In the present example, in order to fabricate the left and right ones as NTFT and PTFT, respectively, phosphorous ions and boron ions are selectively implanted into their active layer regions. For this selective ion implantation, unimplanted regions are coated with a resist. In the step illustrated in FIG. 4(B), the silicon oxide film 51 is etched by RIE without applying resist 501. In this way, both TFTs are completed as TFTs as shown to the right of FIG. 4, (A)–(D). As a result, complementary TFTs consisting of NTFT and PTFT in which contact positions with the source/drain electrodes have been determined by a self-aligning process can be obtained.

In Examples 1–4 described thus far, the gate electrodes are made of aluminum. An oxide layer formed by anodization is formed around the gate electrodes. The gate electrodes may also consist mainly of silicon or a metal. Furthermore, the gate electrodes may be made of a lamination of a semiconductor and a metal. Moreover, the gate electrodes may be made of a metal silicide formed by reacting a silicon semiconductor with a metal provided in contact with the silicon semiconductor. For example, the gate electrodes are made of Ti, Cr, Ta, a lamination layer of Ti, Cr, or Ta and silicon, a silicide (e.g. a silicide of Ti, Cr or Ta), or a lamination layer of Si—W, Si—Mo, or Si—Al.

In the present invention, an insulator is formed adjacent to each gate electrode by a self-aligning process. This automatically determines the contact positions with source/drain regions, i.e. positions at which contacts are made with the source/drain regions. Furthermore, the sheet resistance of the source/drain regions do not present serious problems. Especially, the invention can yield the following advantages: (1) The mask alignment step presents no problems; (2) When contact holes are formed, no problems take place; and (3) The distance between the contact portions and the channel formation region can be set by a self-aligning process.

What is claimed is:

1. A method of fabricating a semiconductor device comprising the steps of:

preparing a semiconductor layer over a substrate;

forming a gate insulating film on said semiconductor layer;

forming a gate electrode on said gate insulating film; implanting impurities to form at least source, drain and channel regions in said semiconductor layer using an oxide on at least sidewalls of said gate as a mask forming an insulator layer over said semiconductor layer said gate electrode and said oxide layer;

etching an entire surface of the insulator layer by anisotropic etching to form side wall insulators adjacent to side walls of the gate electrode and to expose a surface of the source and drain regions of said semiconductor layer from said side wall insulators, wherein a portion of said gate insulating film is etched simultaneously with said insulator layer; and forming at least one source or drain electrode on said side wall insulators and one of said source or drain regions so that said source or drain electrode contacts the exposed portion of the source or drain regions in a self-alignment manner with respect to said side wall insulators, wherein said source or drain electrode is in direct contact with upper and side surfaces of said side wall insulators; and, wherein said channel region extends beyond side walls of said gate electrode to form offset regions.

2. The method of claim 1 wherein a width of said side wall insulators is 2000 to 20000 Å.

3. A method according to claim 1 wherein said source and drain regions are in contact with a bottom surface of said semiconductor layer.

4. A method of fabricating a semiconductor device comprising the steps of:

forming a gate insulating film on a semiconductor:

forming a gate electrode on the gate insulating film;

forming an oxide layer on at least side walls of the gate electrode by oxidizing a surface of said gate electrode;

introducing a dopant impurity into said semiconductor with said gate electrode and said oxide layer as a mask, thereby forming source and drain regions with a channel region defined therebetween;

forming an insulator layer; over said semiconductor and said gate electrode after the introduction of the dopant impurity;

etching the insulator layer by anisotropic etching to form side wall insulators adjacent to the side walls of the gate electrode and to expose a surface of the source and drain regions of the semiconductor from said side wall insulators; and forming at least one source or drain electrode on said side wall insulators and one of said source or drain regions so that said source or drain electrode contacts the exposed portion of the source or drain regions in a self-alignment manner with respect to said side wall insulators wherein said source or drain electrode is in direct contact with upper and side surfaces of said side wall insulators, wherein said channel region includes a pair of offset regions below said oxide layer formed on the side walls of the gate electrode.

5. A method according to claim 4 wherein said oxide layer is formed by anodically oxidizing said gate electrode.

6. A method according to claim 5 wherein said gate electrode comprises aluminum.

7. A method according to claim 4 wherein said gate electrode comprises a semiconductor material.

8. A method according to claim 4 wherein said gate electrode comprises a laminar structure including a semiconductor layer and a metallic layer.

9. A method according to claim 4 wherein said metallic layer comprises a silicide of a metal.

10. A method of fabricating a semiconductor device comprising the steps of:

forming a gate electrode comprising an anodically oxidizable material over a semiconductor layer provided on a glass substrate with a gate insulating layer interposed therebetween;

anodically oxidizing a surface of the electrode to form an anodic oxide on at least side walls of the gate electrode;

introducing a dopant impurity to said semiconductor layer with said gate electrode and the anodic oxide used as a mask to form source and drain regions with a channel region defined therebetween;

forming an insulator layer over the gate electrode and the semiconductor layer after the introduction of the dopant impurity;

etching the insulator layer formed on the anodic oxide and the gate electrode by anisotropic etching to expose an upper surface of the source and drain regions and to leave behind a triangular portion of the insulator layer at a side of the anodic oxide on an unexposed portion of the source and drain; and forming at least one source or drain electrode on said triangular portion and one of said source or drain regions so that said source or drain electrode contacts the exposed portion of the source or drain regions in a self-alignment manner with respect to said triangular portion, wherein said source or drain electrode has a laminar structure including an aluminum layer and a metal layer, said metal layer comprising a material selected from the group consisting of titanium and chromium.

11. A method according to claim 10 wherein said semiconductor layer has a thickness about 1000 Å.

* * * * *